United States Patent
Patel

(10) Patent No.: US 12,426,392 B1
(45) Date of Patent: Sep. 23, 2025

(54) SUBSTRATE WITH RECESSES FOR COMPONENTS PLACEMENT

(71) Applicant: Apple Inc., Cupertino, CA (US)

(72) Inventor: Himesh Patel, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 226 days.

(21) Appl. No.: 17/576,665

(22) Filed: Jan. 14, 2022

Related U.S. Application Data

(60) Provisional application No. 63/138,301, filed on Jan. 15, 2021.

(51) Int. Cl.
 *H10F 39/00* (2025.01)

(52) U.S. Cl.
 CPC .................. *H10F 39/806* (2025.01)

(58) Field of Classification Search
 CPC ................................. H01L 27/14625
 See application file for complete search history.

(56) References Cited

U.S. PATENT DOCUMENTS

| | | | |
|---|---|---|---|
| 7,424,347 B2 * | 9/2008 | Babala .................. | B60G 17/019 701/1 |
| 7,766,517 B2 * | 8/2010 | Kerr ....................... | G06F 1/1601 362/555 |
| 7,893,514 B2 | 2/2011 | Kwon et al. | |
| 8,087,296 B2 * | 1/2012 | Ueda ................... | G01C 19/5607 73/504.16 |
| 8,564,716 B2 | 10/2013 | Kim | |
| 9,029,759 B2 | 5/2015 | Singh et al. | |
| 9,060,111 B2 | 6/2015 | Shukla et al. | |
| 9,167,161 B1 * | 10/2015 | Tam ....................... | H04N 23/57 |
| 9,204,025 B1 * | 12/2015 | Tam .................. | H01L 27/14618 |
| 9,241,097 B1 * | 1/2016 | Tam .................. | H01L 27/14618 |
| 9,935,144 B1 * | 4/2018 | Lin ....................... | H01L 27/1469 |
| 11,412,111 B2 * | 8/2022 | Somei ............... | H01L 27/14618 |
| 11,990,498 B2 * | 5/2024 | Ang ..................... | B81C 1/00246 |
| 2009/0033790 A1 * | 2/2009 | Lin ......................... | G02B 7/023 348/374 |
| 2009/0122176 A1 * | 5/2009 | Wu ........................ | H04N 23/54 348/340 |
| 2012/0194727 A1 * | 8/2012 | Chang .................... | H04N 23/57 348/340 |
| 2013/0270419 A1 * | 10/2013 | Singh ................ | H01L 27/14625 257/E31.127 |
| 2014/0063302 A1 * | 3/2014 | Shukla ................... | H04N 23/57 348/E5.025 |

(Continued)

*Primary Examiner* — Chiawei Chen
(74) *Attorney, Agent, or Firm* — Robert C. Kowert; Kowert, Hood, Munyon, Rankin & Goetzel, P.C.

(57) ABSTRACT

A camera system may include a lens group having one or more lenses and a substrate assembly having an image sensor and one or more other components mounted to the image sensor. The lens group may be movable relative to the image sensor, e.g., to implement an autofocus function. The substrate may include one or more recesses so as to reduce the height of the substrate at the recesses relative to other parts of the substrate. The recesses may be formed at locations specifically selected according to a height clearance requirement between the lens group and the substrate assembly. One or more components distinct from the image sensor may be mounted to the substrate inside the recesses.

20 Claims, 7 Drawing Sheets

(56) References Cited

U.S. PATENT DOCUMENTS

| | | | | |
|---|---|---|---|---|
| 2014/0327790 A1* | 11/2014 | Kim | ..................... | H04N 23/685 |
| | | | | 359/557 |
| 2014/0354877 A1* | 12/2014 | Azuma | .................. | H04N 23/52 |
| | | | | 348/360 |
| 2015/0062706 A1* | 3/2015 | Lim | ..................... | G02B 27/646 |
| | | | | 359/554 |
| 2016/0205300 A1* | 7/2016 | Busse | .................. | H04N 13/239 |
| | | | | 348/374 |
| 2016/0277670 A1* | 9/2016 | Bigioi | ...................... | G03B 3/10 |
| 2017/0048472 A1* | 2/2017 | Yang | ................ | H01L 27/14636 |
| 2017/0200755 A1* | 7/2017 | Teng | ................ | H01L 27/14618 |
| 2017/0280558 A1* | 9/2017 | Ohara | .................... | G03B 17/55 |
| 2018/0301404 A1* | 10/2018 | Morroni | .................. | H01L 23/29 |
| 2019/0267416 A1* | 8/2019 | Kohama | ............ | H01L 27/14618 |
| 2020/0344384 A1* | 10/2020 | Somei | ..................... | H04N 23/54 |
| 2022/0157875 A1* | 5/2022 | Liang | ................ | H01L 27/14636 |
| 2023/0121510 A1* | 4/2023 | Lee | ......................... | H04N 23/51 |
| | | | | 348/294 |

* cited by examiner

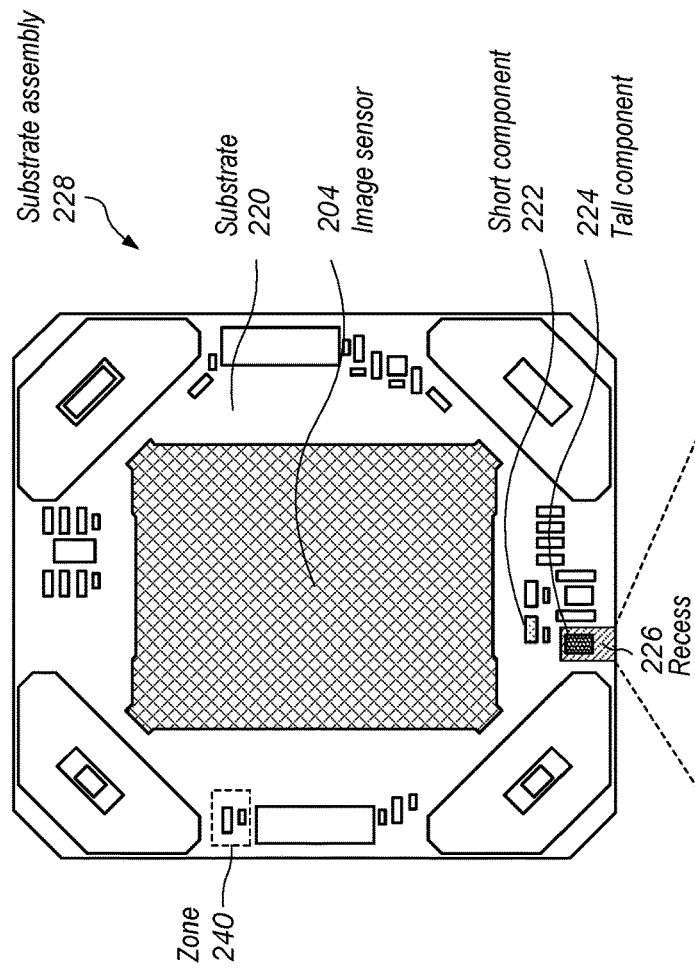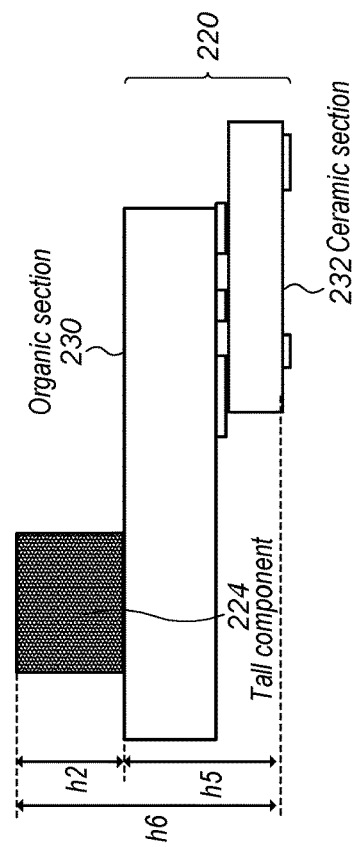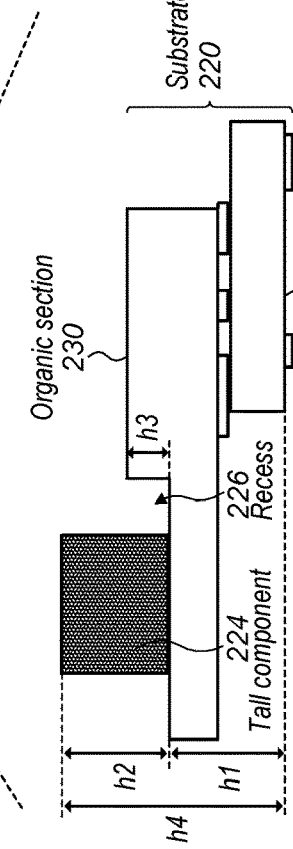
FIG. 2A
FIG. 2B

| Layers of a substrate | An area of a recess | An area without a recess |
|---|---|---|
| Protective layer at a first side | h(pl1) | h(pl1) |
| Routing layer 1 | | h(rl1_nr) |
| Insulation layer 1 | | h(il1_nr) |
| Routing layer 2 | | h(rl2_nr) |
| Insulation layer 2 | | h(il2_nr) |
| Routing layer 3 | | h(rl3_nr) |
| Insulation layer 3 | | h(il3_nr) |
| Routing layer 4 | h(rl4_r) | h(rl4_nr) |
| Insulation layer 4 | h(il4_r) | h(il4_nr) |
| Core | h(c) | h(c) |
| Routing layer 5 | h(rl5_r) | h(rl5_nr) |
| Insulation layer 5 | h(il5_r) | h(il5_nr) |
| Routing layer 6 | h(rl6_r) | h(rl6_nr) |
| Insulation layer 6 | h(il6_r) | h(il6_nr) |
| Routing layer 7 | h(rl7_r) | h(rl7_nr) |
| Insulation layer 7 | h(il7_r) | h(il7_nr) |
| Routing layer 8 | h(rl8_r) | h(rl8_nr) |
| Insulation layer 8 | h(il8_r) | h(il8_nr) |
| Protective layer at a second side | h(pl2) | h(pl2) |

SUBSTRATE WITH RECESSES FOR COMPONENTS PLACEMENT

BACKGROUND

This application claims benefit of priority to U.S. Provisional Application Ser. No. 63/138,301, entitled "Substrate with Recesses for Components Placement," filed Jan. 15, 2021, and which is hereby incorporated herein by reference in its entirety.

TECHNICAL FIELD

This disclosure relates generally to a camera system and more specifically to a camera system with a substrate having recesses for components placement.

DESCRIPTION OF THE RELATED ART

Mobile multipurpose devices such as smartphones, tablet, and/or pad devices are considered as a necessity nowadays. They integrate various functionalities in one small package thus providing tremendous convenience for use. Most, if not all, of today's mobile multipurpose devices include at least one camera. Some cameras may incorporate an autofocus (AF) mechanism whereby the object focal distance can be adjusted to focus an object plane in front of a camera at an image plane to be captured by the image sensor. In some cameras, the AF mechanisms can be implemented by moving the optical lenses as a single rigid body along the optical axis of the camera. Furthermore, some cameras may incorporate an optical image stabilization (OIS) mechanism that can sense and react to external excitation/disturbance by adjusting position of the image sensor relative to the lenses in an attempt to compensate for unwanted motion of the lenses. The advent of the mobile multipurpose devices has resulted in a high requirement for cameras in terms of image quality but also size of the cameras. Therefore, it is desirable to have techniques capable of reducing the footprint of cameras in mobile multipurpose devices.

BRIEF DESCRIPTION OF THE DRAWINGS

FIGS. 2A-2B are top views of a substrate assembly of an example camera system to show the height reduction using recesses for components placement, according to some embodiments.

FIG. 3 is a table showing an example structure of a substrate at two areas with and without a recess, according to some embodiments.

Figures 1A, 1B:
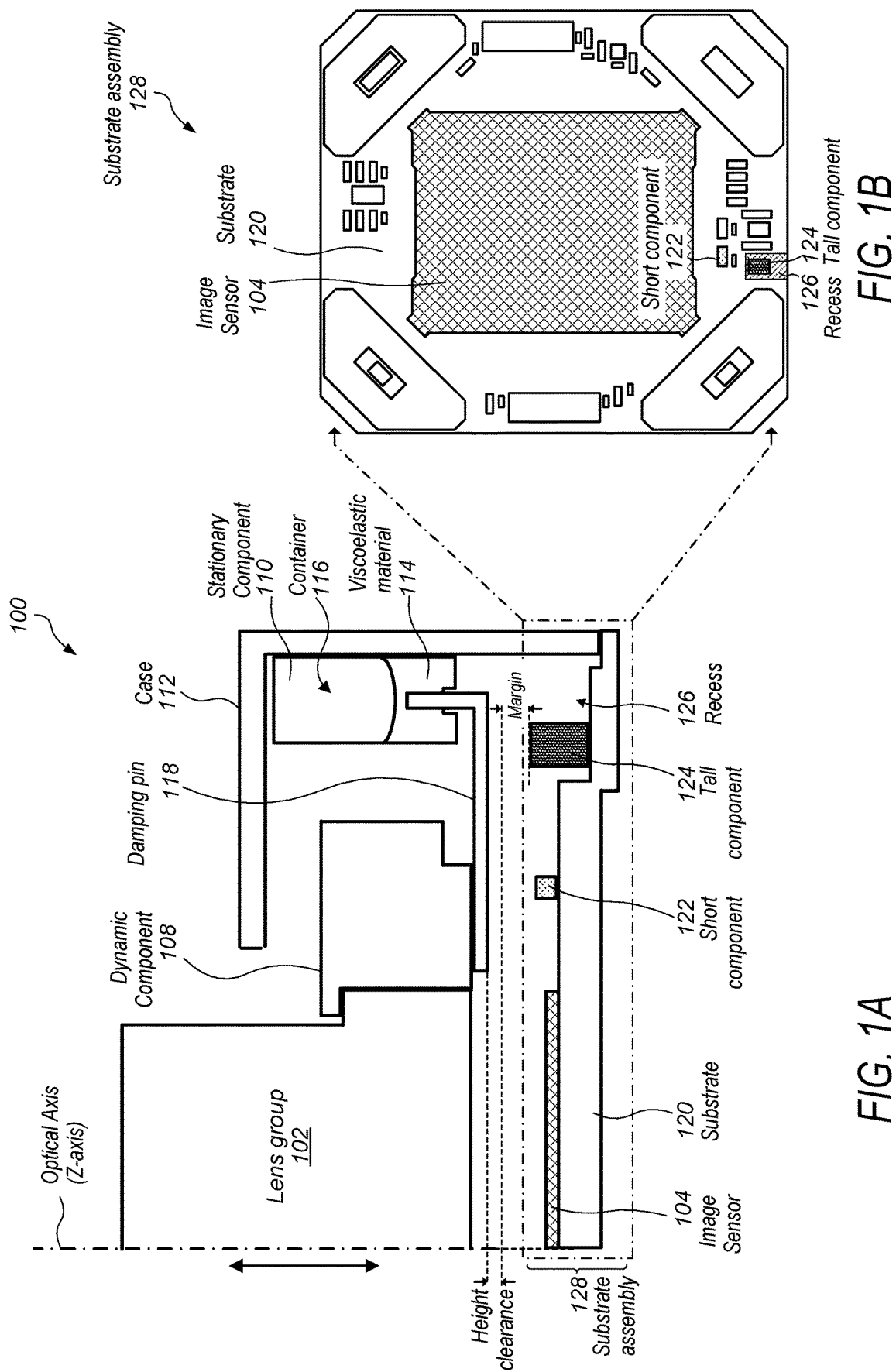
FIG. 1A shows a cross-sectional view of an example camera system including a substrate with recesses for components placement, according to some embodiments.
FIG. 1B shows a top view of a substrate assembly of an example camera system, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112 (f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments described herein relate to a camera system with a substrate having recesses for components placement. In some embodiments, the camera system may include a lens group having one or more lenses and an image sensor. In some embodiments, the image sensor may be mounted to the substrate and movable relative to the lens group, e.g., moved by an actuator. The motion of the image sensor may be used to implement various functions. For instance, the image sensor may be moved relative to the lens group in one or more directions approximately orthogonal to an optical axis of the lens group (e.g., along X- and/or Y-axis) to implement optical image stabilization (OIS). In some embodiments, the image sensor may be moved relative to the lens group in a direction approximately parallel to the optical axis (e.g., along Z-axis) to implement autofocus (AF). In some embodiments, the lens group may not necessarily be fixed at one specific position but rather movable relative to the image sensor, e.g., along Z-axis to implement AF. In short, the image sensor, the lens group, or a combination of both may be movable relative to each other to implement various AF and/or OIS functions. In some embodiments, the camera system may be integrated as part of a mobile multipurpose device, e.g., a smartphone, tablet, pad device, and the like.

In some embodiments, the substrate may serve as an underlining support or base for mounting various components. As described above, in some embodiments, the substrate may host the image sensor, e.g., the image sensor may be mounted at one side of the substrate facing the lens group. In addition, in some embodiments, other components, such as coils (e.g., coils of AF and/or OIS actuators for moving the image sensor as described above), sensors (e.g., position sensors used in controlling AF and/or OIS position adjustments), power supplies (e.g., low-dropout (LDO) voltage regulators to power the image sensor and/or other components), capacitors, inductors, resistors, etc. In this disclosure, for purposes of illustration, the substrate together with the components mounted to the substrate (including, e.g., the image sensor and other components as described above) may be collectively referred to as a substrate assembly.

A substrate generally has an approximately uniform height or thickness. However, in this disclosure, to reduce the footprint of the camera system, the substrate may include one or more recesses so as to reduce the height of the substrate at the recesses relative to other parts of the substrate, according to some embodiments. In addition, the recesses may simplify the manufacturing process of the substrate assembly (e.g., by allowing for single-side surface mounting), reduce warpage, and provide other benefits. In some embodiments, the recesses may be formed at locations to achieve one or more of the above benefits. For instance, a recess may be selected at a location according to a height clearance requirement between the lens group (and the lens holder) and the substrate assembly. For instance, some of the components of the substrate assembly may be taller—e.g., having larger heights—than the other components of the substrate assembly. Therefore, these tall components may more likely become a limiting factor with respect to the reduction of the height and thus overall size of the substrate assembly. As a result, a recess may be formed at a location corresponding to such a tall component, such that the tall component may be mounted inside the recess. Further, a height or depth of the recess may be determined according to the height of the tall component, height of the substrate, and the height clearance requirement between the lens group and substrate assembly. This way, the total height of the substrate assembly at the recess (e.g., a sum of the heights of the substrate and the tall component mounted to the substrate inside the recess) may be lowered, and the height clearance between the lens group and the substrate assembly may be still satisfied. Note that, in some embodiments, the other parts of the substrate, e.g., at locations other than the recess, may be still kept at the "regular" height or thickness in order to maintain the tensile strength of the substrate and/or preserve a sufficient number of layers for routing electrical signals through the substrate. Given that the image sensor may generally be in the form of a low-profile flat panel, the tall component may be a component distinct from the image sensor, according to some embodiments. For instance, the tall component mounted to the substrate inside a recess may include a LDO voltage regulator, a capacitor, drivers for the AF and/or OIS actuator(s), coils, sensors, a portion of the substrate (e.g., one portion of the substrate may be attached to another portion of the substrate using a recess), and so on.

In some embodiments, the substrate may include an organic material, a ceramic material, or a combination of both. In some embodiments, the recess may be formed by eliminating one or more layers of the substrate at the selected location of the recess relative to the other parts of the substrate, reducing the heights or thickness of one or more layers of the substrate at the selected location of the recess, and/or in other approaches.

FIG. 1A shows a cross-sectional view of an example camera system including a substrate with recesses for components placement, according to some embodiments. FIG. 1B shows a top view of a substrate assembly of the example camera system, according to some embodiments. For purposes of illustration, not all but only relevant components are shown in both figures. As shown in this example in FIG. 1A, camera system 100 may include lens group 102 and image sensor 104. In some embodiments, lens group 102 may include one or more lenses (not shown) such that lens group 102 may focus light passing through the one or more lenses on to an image plane at image sensor 104. In some embodiments, lens group 102 may be fixedly coupled with dynamic component 108. For instance, dynamic component 108 may include a lens holder, which may include interior threads such that the one or more lenses of lens group 102 may be screwed into the threads to become fixedly coupled with the lens holder and thus dynamic component 108. In some embodiments, camera system 100 may include an AF actuator (not shown) which may have one or more coils and one or more corresponding magnets. In some embodiments, the coils may be fixedly coupled with (e.g., placed inside) dynamic component 108, whilst the magnets may be fixedly coupled with (e.g., placed inside) stationary component 110. The current flowing through the coils of the AF actuator may interact with the magnet field of the magnets, and thus generate motive force (e.g., Lorentz force) to move the coils (together with dynamic component 108 and lens group 102) relative to the magnets (together with stationary component 110), e.g., in a direction approximately parallel to the optical axis of lens group 102 (e.g., along Z-axis).

In some embodiments, image sensor 104 may be mounted or attached to substrate 120 through a suspension assembly (not shown), e.g., at one side of substrate 120 facing lens group 102. In some embodiments, substrate 120 may be fixedly coupled with case 112 of camera system 100, which may be further fixed coupled with stationary component 110. In some embodiments, the suspension assembly may provide fixed or rigid coupling between image sensor 104 and substrate 120 in Z axis, but flexible connection or freedom of motion in X- and/or Y-axis. Therefore, as described above, lens group 102 (with dynamic component 108) may be movable relative to image sensor 104 (with substrate 120, case 112, and stationary component 110) along Z-axis to implement AF.

In addition, camera system 100 may include an OIS actuator (not shown) which may have one or more coils and one or more corresponding magnets. In some embodiments, the coils may be fixedly coupled with image sensor 104 (e.g., through some other interface components). In some embodiments, the OIS actuator may share the same magnets (e.g., those described above fixedly coupled with stationary component 110) with the AF actuator, or use separate magnets fixedly coupled with stationary component 110. Similarly, the current flowing through the coils of the OIS actuator may interact with the magnet field of the magnets, and thus generate motive force (e.g., Lorentz force) to move image sensor 104 relative to lens group 102, e.g., along X- and/or Y-axis, to thus implement OIS. Note that, for purposes of illustration, in the example of FIG. 1A, the AF function is described to be implemented by motion of lens group 102 (e.g., along Z axis), and the OIS function is described to be performed by motion of image sensor 104 (e.g., along X- and/or Y-axis). However, as described above, in some embodiments, lens group 102 or image sensor 104 alone may be movable along (1) Z-axis and (2) X- and/or Y-axis, and thus implement both AF and OIS functions. Note that FIG. 1A is provided only as an example for purposes of illustration. In some embodiments, camera system 100 may adopt a flip-chip design where image sensor 104 may be mounted at another side of substrate 120 (e.g., the underneath side of substrate 120 in FIG. 1A) that is opposite to and away from lens group 102. In the flip-chip design, substrate 120 may further include an opening, e.g., above image sensor 104 mounted to the underneath side of substrate 120, through which image sensor 104 may receive light passing through lens group 102.

In some embodiments, camera system 100 may use viscoelastic material 114 (e.g., gel, grease, etc.) to provide passive damping for motion control of relatively movable component(s). In some embodiments, viscoelastic material 114 may be held in container 116 which may be placed, e.g., within stationary component 110. In some embodiments, camera system 100 may include damping pin 118 connecting the relatively movable component(s) (e.g., lens group 102 in the example of FIG. 1A) and viscoelastic material 114. For instance, a first end of damping pin 118 may be fixedly coupled with dynamic component 108 (which may be further fixedly coupled with lens group 102, as described above), and a second end of damping pin 118 may extend in to viscoelastic material 114. Therefore, when lens group 102 (with dynamic component 108 and the first end of damping pin 118) moves relative to image sensor 104, e.g., along Z axis, the second end of damping pin 118 may also move accordingly inside viscoelastic material 114. The resistance or friction of viscoelastic material 114 may provide the passive damping to the motion of lens group 102.

One way to reduce the footprint of camera system 100 may be to lower a height (or Z-height) of substrate assembly 128, e.g., along Z axis. In some embodiments, the motion of lens group 102 relative to image sensor 104 may be subject to a height clearance requirement as shown in FIG. 1A. This height clearance requirement may indicate a spatial safety gap between lens group 102 (and lens holder) and substrate assembly 128 to avoid a collision between a relatively movable component (e.g., lens group 102 in this example) and a relatively stationary component (e.g., substrate assembly 128) during motion of the relatively movable component (e.g., lens group 102). The height clearance requirement may be defined with respect to the lowest possible point of the relatively movable component, e.g., the bottom of damping 118 in this example. In some embodiments, this reference point may be at a different component of camera system 100 depending on the structure of camera system 100.

To reduce the height of substrate assembly 128 but still maintain the height clearance, substrate 120 may include recess 126 so as to reduce the height of substrate 120 at recess 126 relative to other parts of substrate 120. In some embodiments, recess 126 may be formed at a location specifically selected according to the height clearance requirement between lens group 102 and substrate assembly 128. For instance, as shown in FIG. 1A, component 124 may be taller—e.g., having a larger height—than component 122. Thus, tall component 124 may more likely become a limiting factor with respect to the reduction of the height of substrate assembly 128. Therefore, recess 126 may be selected at the location corresponding to tall component 124, such that tall component 124 may be mounted to substrate 120 inside recess 126. As shown in FIG. 1A, the height or thickness of substrate 120 may get reduced at the location of recess 126 relative to other parts of substrate 120. Further, a height or depth of recess 126 may be determined according to the height of tall component 124, height of substrate 120, and height clearance requirement between lens group 102 and substrate assembly 128. This way, the total height of substrate assembly 128 at recess 126 (e.g., a sum of the heights of substrate 120 and tall component 124 mounted to substrate 120 inside recess 126) may be lowered, and the height clearance between lens group 102 and substrate assembly 128 may still be satisfied, e.g., as indicated by the margin and height clearance requirement in FIG. 1A.

FIG. 1B shows a top view of substrate assembly 128, corresponding to FIG. 1A. As shown in FIG. 1B, tall component 124 may be a component distinct from image sensor 104. In this example, tall component 124 may be a LDO voltage regulator. As described above, in some embodiments, the component mounted inside recess 126 may include a capacitor, an inductor, a resistor, drivers for the AF and/or OIS actuator(s), coils, sensors, a portion of the substrate, or some other components distinct from image sensor 104 that are mounted to substrate 120. In addition, for purposes of illustration, only one recess 126 is depicted in FIGS. 1A-1B. In some embodiments, substrate 120 may include multiple recesses at multiple selected locations. Moreover, in some embodiments, the recesses may be in various shapes, e.g., according to the location of the recesses and a shape of the components to be mounted inside the recesses. For instance, when a recess is selected near an edge of the substrate, the recess may be an indentation (e.g., like recess 126 in FIGS. 1A-1B which may include an un-enclosed wall surrounding the recess). Alternatively, when the recess is located near the middle of the substrate, the recess may be a cavity (e.g., including an enclosed wall surrounding the recess).

FIGS. 2A-2B are top views of a substrate assembly of an example camera system to show the height reduction using recesses for components placement, according to some embodiments. As shown in FIG. 2A, in some embodiments, substrate assembly 228 may include image sensor 204 and one or more other components (e.g., short component 222 and tall component 224) distinct from image sensor 204 that are mounted to substrate 220. The lower figure in FIG. 2A is the zoom-in view of an area of substrate 220 that may include recess 226 (e.g., with a height of h3), as indicated by the rectangular in the upper figure in FIG. 2A, whilst FIG. 2B shows a zoom-in view of the same area but without a recess. As shown in FIGS. 2A-2B, substrate 220 may include organic section 230 (using one or more organic materials) and ceramic section 232, two of which may be joined together at a bond line with gluing material and/or electrical signal wires. Note that in some embodiments, substrate 220 may be made entirely of organic material(s), ceramic material, or a combination of other appropriate materials. In some embodiments, substrate 220 may include recess 226, e.g., at the side of substrate 220 facing a lens group of the camera system (e.g., the top side of substrate 120 facing lens group 102 in FIG. 1A), and tall component 224 may be mounted to substrate 220 inside recess 226. As shown in FIGS. 2A-2B, recess 226 may have a height or depth of h3. With recess 226, the height of substrate 220 may reduce from h5 (e.g., the regular height or thickness without recess) to h1 at the location of recess 226, and the total height of substrate assembly 228—e.g., a sum of the height of substrate 220 (e.g., h1 in FIG. 2A and h5 in FIG. 2B) and tall component 224 (e.g., h2)—may reduce from h6 (e.g., a sum of h5 and h2) to h4 (e.g., a sum of h1 and h2). In other words, by using recess 226, the height of substrate assembly 228 may be decreased, which may help to reduce the overall footprint of the camera system. As described above, the height or depth of recess 226 (e.g., h3) may be determined according to the height of tall component 224 (e.g., h3) that is mounted inside recess 226, height of substrate 220 (e.g., h5), and/or height clearance requirement between substrate assembly 228 and the corresponding relatively movable component (e.g., lens group 102 shown in FIG. 1A).

In some embodiments, the total height of substrate 220 and tall component 224 mounted inside recess 226 (e.g., h4) may be in a range between 820 and 960 micrometers. In some embodiments, the height of substrate 220 at the location of recess 226 (e.g., h1) may be in a range between 500 and 570 micrometers. In some embodiments, the height of substrate 220 at locations other than recess 226 (e.g., h5 or the regular height or thickness of substrate 220) may be in a range between 610 and 700 micrometers. In some embodiments, the height or depth of recess 226 (e.g., h3) may be in a range between 100 and 140 micrometers.

Figure 2C:
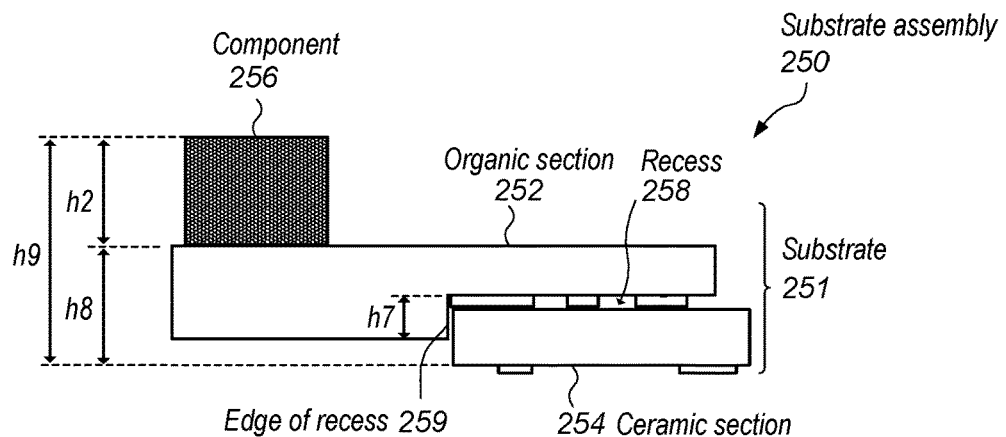
FIGS. 2C-2E are top views of additional examples of a substrate assembly that includes a recess for component placement, according to some embodiments.
Figure 2D:
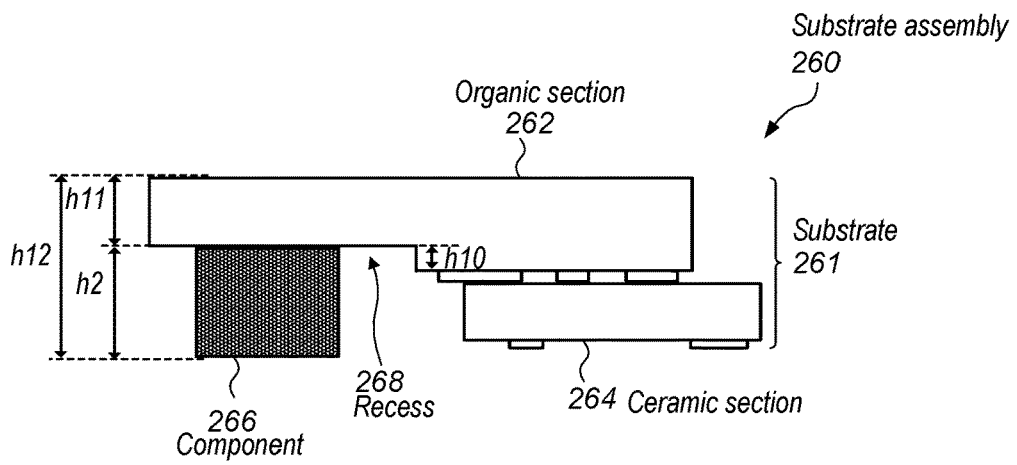
Figure 2E:
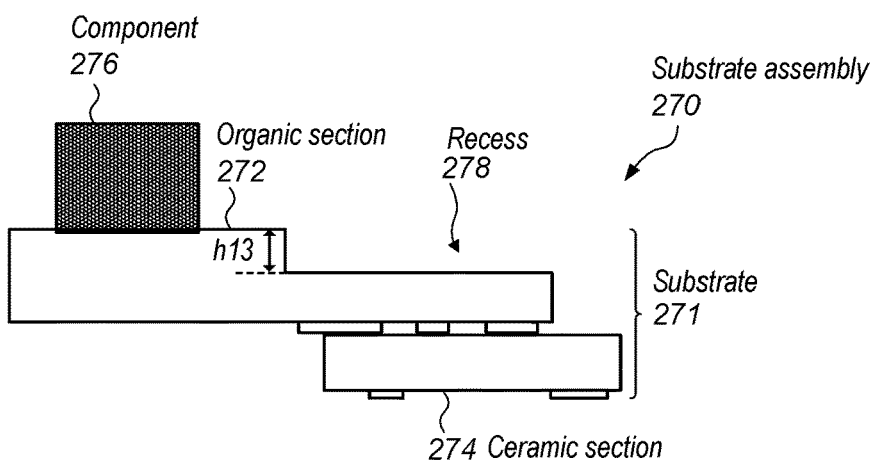

FIGS. 2C-2E show top views of some additional examples of a substrate assembly including a recess for component placement, according to some embodiments. For instance, as shown in FIG. 2C, substrate assembly 250 may include recess 258 (e.g., with a height of h7) at organic section 252 of substrate 251, for ceramic section 254 to be attached to organic portion 252 of substrate 251. Depending on the spatial relationship between organic section 252 and ceramic section 254, in this example, recess 258 may be formed at the side of substrate 251 that is opposite to or away from the lens group of the camera (e.g., at the bottom side of substrate 120 that is not facing lens group 102 in FIG. 1A). Recess 258 may reduce the height or thickness of substrate 251, e.g., from h5 to h8 when referring to FIG. 2B. For purposes of illustration, assuming component 256 mounted to the side of substrate 120 facing the lens group has a height h2, the total height of substrate assembly 250 (including both substrate 251 and component 256) may be reduced from h6 (e.g., a sum of h2 and h5) to h9 (e.g., a sum of h2 and h8). The location and height of recess 258 may be determined according to the height clearance requirement between the lens group (and lens holder) and substrate assembly 250, as described above. In addition, recess 258 may reduce the warpage at the joint between organic section 252 and ceramic section 254. Warpage is generally caused by differential deformation (e.g., shrinkage, expansion, bending, etc.) of materials at a connection. As shown in FIG. 2C, recess 258 may create edge 259 that may constrain the region where ceramic section 254 may be deformed. As a result, the warpage between organic section 252 and ceramic section 254 may be reduced.

In FIG. 2D, recess 268 (e.g., with a height h10) may be formed at the side of substrate 261 that is opposite to or away from the lens group of the camera (e.g., at the bottom side of substrate 120 that is not facing lens group 102 in FIG. 1A) for placing component 266. This may reduce the height or thickness of substrate 261, e.g., reducing the height by h10 at recess 268 of organic section 262. For purposes of illustration, assuming the height of component 266 is h2 and is taller than ceramic section 264, recess 268 may reduce the total height of substrate assembly 260 (including substrate 261 and component 266), e.g., from h6 (e.g., a sum of h2 and h5) to h12 (e.g., a sum of h2 and h11). In addition, because component 266 is moved to the same side as ceramic section 264, this may simplify the manufacturing process of substrate assembly 260. For instance, component 266 and ceramic section 264 may be attached to organic section 262 in one single reflow of surface mounting process.

In FIG. 2E, recess 278 (e.g., with a height h13) may be formed to improve the height clearance between the lens group (and lens holder) (e.g., like lens group 102 in FIG. 1A) and the image sensor on substrate assembly 270 (e.g., like image sensor 104 in FIG. 1A) of a camera. For instance, recess 278 may be formed at the side of substrate 270 facing the lens group, and at the location corresponding to the lens group. Accordingly, this may increase the distance, e.g., along Z-axis, between the lens group (and lens holder) and the image sensor and thus allow for a larger clearance for motion of the lens group and/or the image sensor. Note that the examples in FIGS. 2A-2E are provided for purposes of illustration only. In some embodiments, additional design of the recess on the substrate may be adopted. In addition, several designs of the recess may be combined. For instance, a recess may be formed at one side of a substrate (e.g., like recess 226 in FIG. 2A) for placement of one component (e.g., like component 224 in FIG. 2A) and another recess may be formed at an opposite side of the substrate (e.g., like recess 258 in FIG. 2C) for placement of another component (e.g., like ceramic section 254 in FIG. 2C). Further, for purposes of illustration, in the above figures, the recess is illustrated to be formed at the organic section of a substrate. In some embodiments, the recess may be formed at a ceramic section of a substrate or a ceramic substrate.

The above described recess in a substrate of a camera system may be formed in various approaches. In some embodiments, a recess may be formed by eliminating one or more layers of the substrate at the location of the recess relative to other parts of the substrate. For instance, the substrate may be formed using an electroforming process, where the layers may be formed in sequence with one or more lithography, direct deposition, and/or etching processes. Alternatively, in some embodiments, the substrate may be formed using a single-shot or multi-shot injection molding process, where the layers may be formed by molding one or more materials through single- or multi-shots. Therefore, given a location and height of a recess, one or more layers of the substrate may be removed at the selected location of the recess (e.g., during the lithography and/or etching processes) during formation of the substrate. Alternatively, in some embodiments, the one or more layers may be excluded (e.g., from the direct deposition or molding process) such that the layers would be removed from the substrate. As a result, for instance, the substrate may have only five layers at the location of the recess, but eight layers at the other parts of the substrate. In some embodiments, the recess may be formed by reducing the heights or thickness of one or more layers of the substrate at the location of the recess relative to other parts of the substrate. For instance, the direct deposition may be controlled such that the substrate may have an equal number of layers across the entire substrate, but one or more thinner layers at the location of the recess relative to the other parts of the substrate. As described above, the substrate may use the recess to reduce the Z-height, but may still want to maintain a regular height or thickness to maintain the tensile strength and/or preserve a sufficient number of layers for routing electrical signals through the substrate.

FIG. 3 is a table showing an example structure of a substrate at two areas with and without a recess, according to some embodiments. In this example, the substrate (e.g., like substrate 220 in FIG. 2) may include eight internal layers (e.g., routing layer 1, routing layer 2, . . . , routing layer 8) each of which may be separated from an adjacent routing layer with an insulation layer (e.g., insulation layer 1, insulation layer 2, . . . , insulation layer 8), a core layer, and two protective layers at each side of the substrate. Note that the term "routing layer" may broadly refer to an internal layer of the substrate that may be used to route a signal, a ground bus, or a power bus (e.g., serving as the ground or power planes). As shown in FIG. 3, each cell in the table may indicate a height or thickness of the corresponding layer. For instance, h (rl4_r) may refer to the height or thickness of the routing layer 4 of the substrate at the area of a recess (e.g., like recess 226 in FIG. 2), whilst h (rl4_nr) may indicate the height or thickness of the routing layer 4 of the substrate at the area without a recess (e.g., like zone 240 in FIG. 2). In this example, the recess may be created by including fewer number of layers at the area of the recess (e.g., five internal layers) than the area without the recess (e.g., eight internal layers), as described above. Therefore, the heights of the routing layers 1-3 and insulation layers 1-3 at the area of the recess are blank. In addition, in some embodiments, the recess may be created by reducing the heights or thickness of one or more layers of the substrate at the area of the recess than the area without the recess. For instance, the height of the routing layer 4 (e.g., h (rl4_r)) at the area of the recess may be less than the height of the routing layer 4 (e.g., h (rl4_nr)) at the area without the recess—e.g., h (rl4_r)<h (rl4_nr). Note that the above example in FIG. 3 is provided only as an example for purposes of illustration. The structure of the substrate (including, e.g., the number of layers and/or heights of the layers) may be different in some embodiments.

Figure 4:
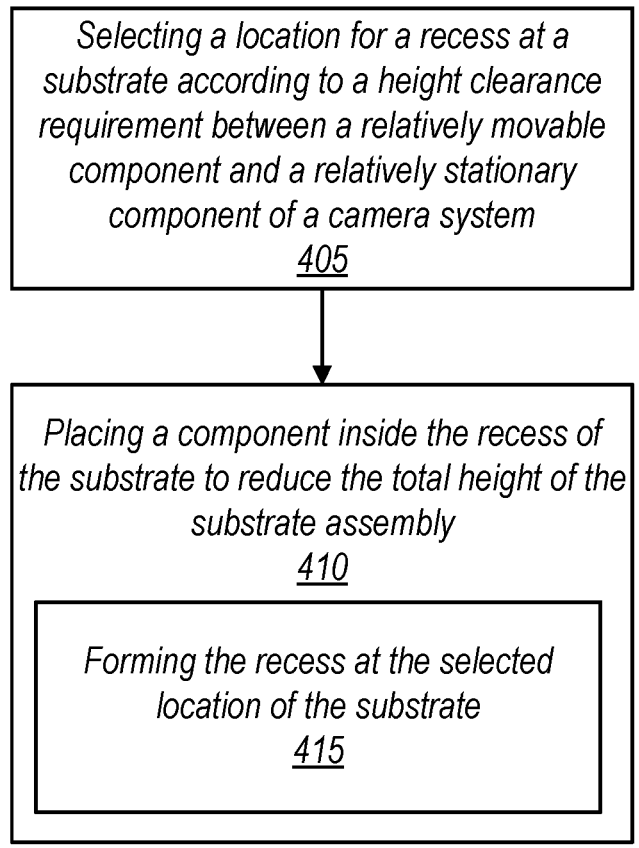
FIG. 4 is a high-level diagram flowchart showing methods and techniques for using recesses to place components at a substrate, according to some embodiments.

FIG. 4 is a high-level diagram flowchart showing methods and techniques for using recesses to place components at a substrate, according to some embodiments. As shown in this example, a location at a substrate may be identified to form a recess at the substrate, as indicated in block 405. As described above, the location for the recess may be selected according to a height clearance requirement between a relatively movable component (e.g., lens group 102 in FIG. 1) and a relatively stationary component (e.g., substrate assembly 128 in FIG. 1) of a camera system. For instance, a location for the recess may be identified based on the height or thickness of the substrate and/or the height of a component (e.g., tall component 124 in FIG. 1) that may be mounted to the substrate inside the recess in order to satisfy the height clearance requirement. In some embodiments, a margin (e.g., like the margin shown in FIG. 1) may be included to ensure that the relatively movable component would not collide with the relatively stationary component after placement of the component inside the recess. In some embodiments, the component (e.g., tall component 124 in FIG. 1) may be mounted to the substrate inside the recess to reduce the total height of the substrate assembly, as indicated in block 410. For instance, as described above with regards to FIG. 2, with the recess, the total height of the substrate assembly (e.g., along the Z-axis) may be reduced from h6 to h4. In some embodiments, the recess of a given height may be formed at the identified location of the substrate in various approaches, as indicated in block 415, e.g., by controlling the formation of the substrate as described above. For instance, the approaches to form the recess at the identified location may include controlling (1) one or more lithography, direct deposition, and/or etching of an electroforming process or (2) single- or multi-shot injection molding process to eliminate one or more layers from the substrate at the location of the recess relative to other parts of the substrate, or to reduce the heights or thickness of one or more layers of the substrate at the location of the recess relative to other parts of the substrate. Note that the operations discussed above in blocks 405, 410, and 415 may or may not be performed by one single party at one place consecutively. For instance, in some embodiments, some of these operations in blocks 405, 410, and 415 may be performed by different parties, at different places and/or times.

Figure 5:
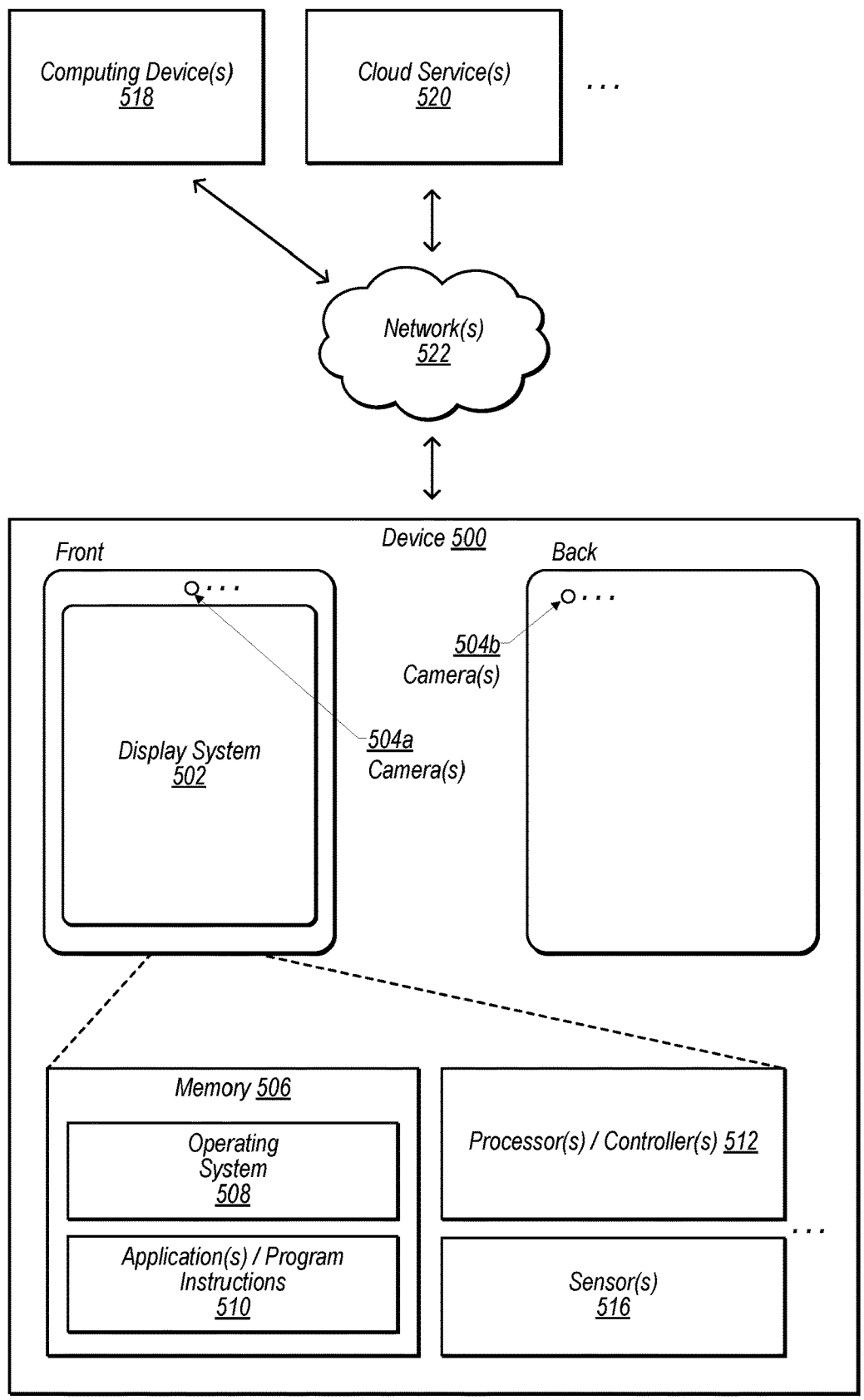
FIG. 5 illustrates a schematic representation of an example device that may include a camera system including a substrate with recesses for components placement, according to some embodiments.

FIG. 5 illustrates a schematic representation of an example device 500 that may include a camera system (e.g., the camera system described above in FIGS. 1-4) including a substrate with recesses for components placement, according to some embodiments. In some embodiments, the device 500 may be a mobile device and/or a multifunction device. In various embodiments, the device 500 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In some embodiments, the device 500 may include a display system 502 (e.g., comprising a display and/or a touch-sensitive surface) and/or one or more cameras 504. In some non-limiting embodiments, the display system 502 and/or one or more front-facing cameras 504*a* may be provided at a front side of the device 500, e.g., as indicated in FIG. 5. Additionally, or alternatively, one or more rear-facing cameras 504*b* may be provided at a rear side of the device 500. In some embodiments comprising multiple cameras 504, some or all of the cameras may be the same as, or similar to, each other. Additionally, or alternatively, some or all of the cameras may be different from each other. In various embodiments, the location(s) and/or arrangement(s) of the camera(s) 504 may be different than those indicated in FIG. 5.

Among other things, the device 500 may include memory 506 (e.g., comprising an operating system 508 and/or application(s)/program instructions 510), one or more processors and/or controllers 512 (e.g., comprising CPU(s), memory controller(s), display controller(s), and/or camera controller(s), etc.), and/or one or more sensors 516 (e.g., orientation sensor(s), proximity sensor(s), and/or position sensor(s), etc.). In some embodiments, the device 500 may communicate with one or more other devices and/or services, such as computing device(s) 518, cloud service(s) 520, etc., via one or more networks 522. For example, the device 500 may include a network interface (e.g., network interface 510) that enables the device 500 to transmit data to, and receive data from, the network(s) 522. Additionally, or alternatively, the device 500 may be capable of communicating with other devices via wireless communication using any of a variety of communications standards, protocols, and/or technologies.

Figure 6:
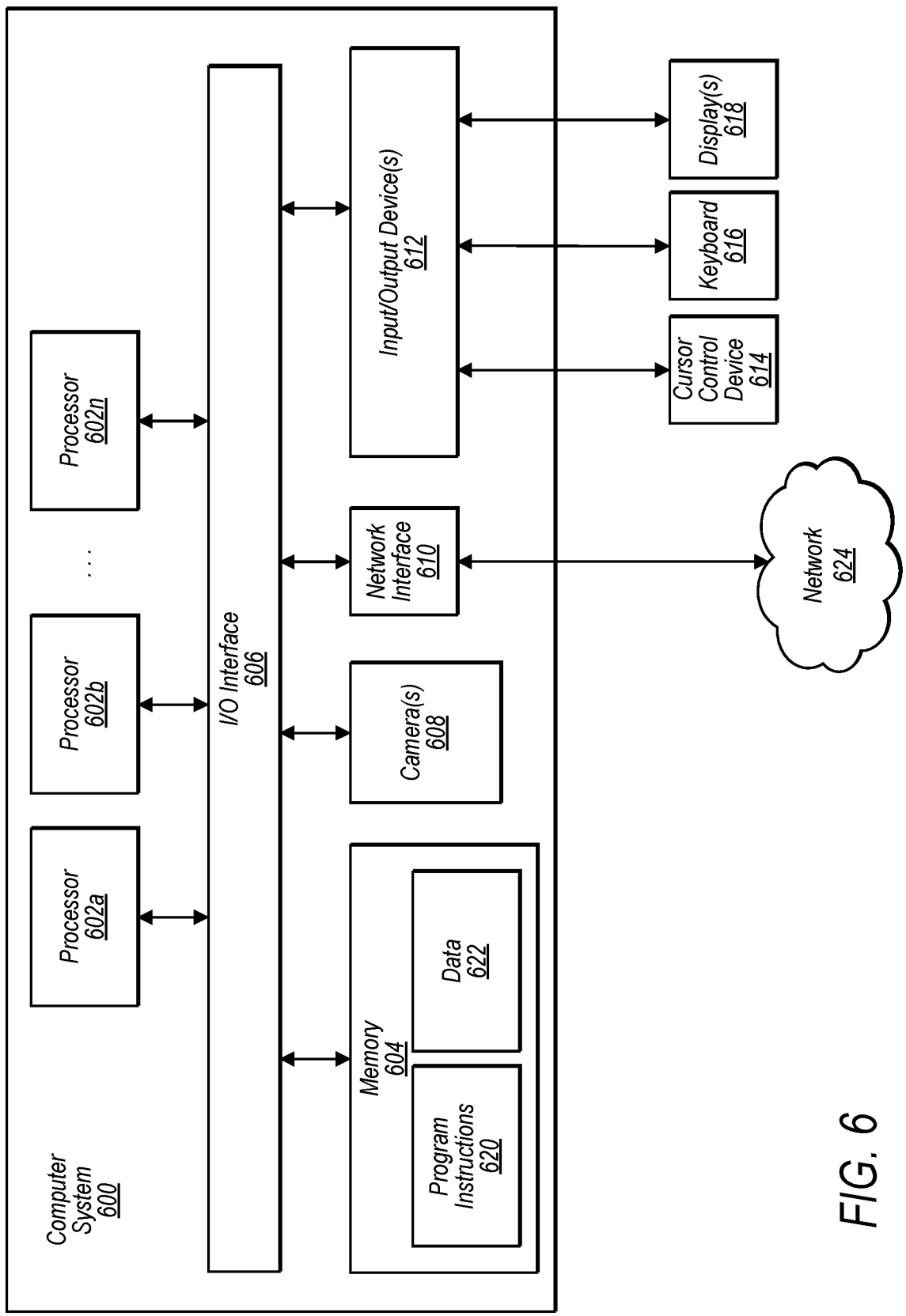
FIG. 6 illustrates a schematic block diagram of an example computer system that may include a camera system including a substrate with recesses for components placement, according to some embodiments.

FIG. 6 illustrates a schematic block diagram of an example computing device, referred to as computer system 600, that may include or host embodiments of a camera system including a substrate with recesses for components placement, e.g., as described herein with reference to FIGS. 1-5, according to some embodiments. In addition, computer system 600 may implement methods for controlling operations of the camera and/or for performing image processing images captured with the camera. In some embodiments, the device 500 (described herein with reference to FIG. 5) may additionally, or alternatively, include some or all of the functional components of the computer system 600 described herein.

The computer system 600 may be configured to execute any or all of the embodiments described above. In different embodiments, computer system 600 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 600 includes one or more processors 602 coupled to a system memory 604 via an input/output (I/O) interface 606. Computer system 600 further includes one or more cameras 608 coupled to the I/O interface 606. Computer system 600 further includes a network interface 610 coupled to I/O interface 606, and one or more input/output devices 612, such as cursor control device 614, keyboard 616, and display(s) 618. In some cases, it is contemplated that embodiments may be implemented using a single instance of computer system 600, while in other embodiments multiple such systems, or multiple nodes making up computer system 600, may be configured to host different portions or instances of embodiments. For example, in one embodiment some elements may be implemented via one or more nodes of computer system 600 that are distinct from those nodes implementing other elements.

In various embodiments, computer system 600 may be a uniprocessor system including one processor 602, or a multiprocessor system including several processors 602 (e.g., two, four, eight, or another suitable number). Processors 602 may be any suitable processor capable of executing instructions. For example, in various embodiments processors 602 may be general-purpose or embedded processors implementing any of a variety of instruction set architectures (ISAs), such as the x86, PowerPC, SPARC, or MIPS ISAs, or any other suitable ISA. In multiprocessor systems, each of processors 602 may commonly, but not necessarily, implement the same ISA.

System memory 604 may be configured to store program instructions 620 accessible by processor 602. In various embodiments, system memory 604 may be implemented using any suitable memory technology, such as static random access memory (SRAM), synchronous dynamic RAM (SDRAM), nonvolatile/Flash-type memory, or any other type of memory. Additionally, existing camera control data 622 of memory 604 may include any of the information or data structures described above. In some embodiments, program instructions 620 and/or data 622 may be received, sent or stored upon different types of computer-accessible media or on similar media separate from system memory 604 or computer system 600. In various embodiments, some or all of the functionality described herein may be implemented via such a computer system 600.

In one embodiment, I/O interface 606 may be configured to coordinate I/O traffic between processor 602, system memory 604, and any peripheral devices in the device, including network interface 610 or other peripheral interfaces, such as input/output devices 612. In some embodiments, I/O interface 606 may perform any necessary protocol, timing or other data transformations to convert data signals from one component (e.g., system memory 604) into a format suitable for use by another component (e.g., processor 602). In some embodiments, I/O interface 606 may include support for devices attached through various types of peripheral buses, such as a variant of the Peripheral Component Interconnect (PCI) bus standard or the Universal Serial Bus (USB) standard, for example. In some embodiments, the function of I/O interface 606 may be split into two or more separate components, such as a north bridge and a south bridge, for example. Also, in some embodiments some or all of the functionality of I/O interface 606, such as an interface to system memory 604, may be incorporated directly into processor 602.

Network interface 610 may be configured to allow data to be exchanged between computer system 600 and other devices attached to a network 624 (e.g., carrier or agent devices) or between nodes of computer system 600. Network 624 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 610 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 612 may, in some embodiments, include one or more display terminals, keyboards, keypads, touchpads, scanning devices, voice or optical recognition devices, or any other devices suitable for entering or accessing data by one or more computer systems 600. Multiple input/output devices 612 may be present in computer system 600 or may be distributed on various nodes of computer system 600. In some embodiments, similar input/output devices may be separate from computer system 600 and may interact with one or more nodes of computer system 600 through a wired or wireless connection, such as over network interface 610.

Those skilled in the art will appreciate that computer system 900 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 900 may be transmitted to computer system 900 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A system, comprising:
    a substrate assembly including an image sensor, and one or more other components mounted to a substrate;
    a lens group including one or more lenses configured to be movable relative to the image sensor,
        wherein the substrate is configured to include at least one recess so as to reduce a height of the substrate at the recess relative to other parts of the substrate, wherein the recess is formed at a location that is selected for mounting at least one component distinct from the image sensor to a layer of the substrate inside the recess, wherein the recess is located in the substrate at a location outside a perimeter of the image sensor in a direction orthogonal to an optical axis to the image sensor, and wherein the image sensor is mounted to a different layer of the substrate than the at least one component; and
    a casing configured to at least partially encase the recess and the image sensor.

2. The system of claim 1, wherein the location of the at least one recess is selected according to a height clearance requirement between the lens group and the substrate assembly.

3. The system of claim 1, wherein the at least one component mounted to the substrate inside the recess includes one of a low-dropout (LDO) voltage regulator, a capacitor, a coil for an actuator, a driver for an actuator, a sensor, or a portion of the substrate.

4. The system of claim 1, wherein the at least one recess is formed at either a first side of the substrate facing the lens group or a second side of the substrate opposite to the first side.

5. The system of claim 1, wherein the at least one recess is formed by eliminating one or more layers of the substrate at the selected location relative to the other parts of the substrate.

6. The system of claim 1, wherein the at least one recess is formed by reducing heights of one or more layers of the substrate at the selected location relative to the other parts of the substrate.

7. The system of claim 1, wherein the lens group defines an optical axis, and wherein the height of the substrate is measured in a direction parallel to the optical axis.

8. The system of claim 1, wherein a total height of the substrate and the at least one component mounted to the substrate inside the recess is in a range between 820 and 960 micrometers.

9. The system of claim 1, wherein the height of the substrate at the location of the recess is in a range between 500 and 570 micrometers.

10. The system of claim 1, wherein the height of the other parts of the substrate is in a range between 610 and 700 micrometers.

11. The system of claim 1, wherein a height of the at least one recess is in a range between 100 and 140 micrometers.

12. A device, comprising:
a lens group including one or more lenses configured to be movable relative to an image sensor,
a substrate assembly including the image sensor and one or more other components mounted to a substrate, wherein the image sensor is configured to generate signals based on light passing through the one or more lenses of the lens group;
a processor configured to process the signals from the image sensor to generate an image,
wherein the substrate is configured to include at least one recess so as to reduce a height of the substrate at the recess relative to other parts of the substrate, wherein the recess is formed at a location that is selected for mounting at least one component distinct from the image sensor to the substrate inside the recess, wherein the recess is located in the substrate at a location outside a perimeter of the image sensor in a direction orthogonal to an optical axis into the image sensor, and wherein, due to the recess, the at least one component distinct from the image sensor is mounted at a different depth of the substrate than the image sensor; and
a casing configured to at least partially encase the recess and the image sensor.

13. The system of claim 12, wherein the location of the at least one recess is selected according to a height clearance requirement between the lens group and the substrate assembly.

14. The system of claim 12, wherein the at least one component mounted to the substrate inside the recess includes one of a low-dropout (LDO) voltage regulator, a capacitor, a coil for an actuator, a driver for an actuator, a sensor, or a portion of the substrate.

15. The system of claim 12, wherein the at least one recess is formed at either a first side of the substrate facing the lens group or a second side of the substrate opposite to the first side.

16. The system of claim 12, wherein the at least one recess is formed by eliminating one or more layers of the substrate at the selected location relative to the other parts of the substrate.

17. The system of claim 12, wherein the at least one recess is formed by reducing heights of one or more layers of the substrate at the selected location relative to the other parts of the substrate.

18. The system of claim 12, wherein the height of the substrate at the location of the recess is in a range between 500 and 570 micrometers.

19. A method, comprising:
identifying a location at a substrate of a camera system according to a predetermined height clearance requirement to form a recess at the substrate so as to reduce a height of the substrate at the recess relative to other parts of the substrate; and
placing a component distinct from an image sensor of the camera system to the substrate inside the recess, wherein the recess is located in the substrate at a location outside a perimeter of the image sensor in a direction orthogonal to an optical axis into the image sensor, wherein, due to the recess, the at least one component distinct from the image sensor is mounted at a different depth of the substrate than at least the image sensor, and wherein the recess and the image sensor are at least partially encased within a casing.

20. The method of claim 19, wherein the recess is formed by eliminating one or more layers of the substrate at the identified location relative to the other parts of the substrate or reducing heights of one or more layers of the substrate at the identified location relative to the other parts of the substrate.

* * * * *